(12) United States Patent
Takahashi et al.

(10) Patent No.: US 8,034,651 B2
(45) Date of Patent: Oct. 11, 2011

(54) LIGHT RECEIVING DEVICE AND METHOD OF MANUFACTURING LIGHT RECEIVING DEVICE

(75) Inventors: Toyosei Takahashi, Tokyo (JP); Rie Takayama, Tokyo (JP); Mitsuo Sugino, Tokyo (JP); Masakazu Kawata, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 12/668,341

(22) PCT Filed: Feb. 19, 2008

(86) PCT No.: PCT/JP2008/000260
§ 371 (c)(1),
(2), (4) Date: Jan. 8, 2010

(87) PCT Pub. No.: WO2009/008106
PCT Pub. Date: Jan. 15, 2009

(65) Prior Publication Data
US 2010/0258713 A1     Oct. 14, 2010

(30) Foreign Application Priority Data

Jul. 12, 2007  (JP) ................................ 2007-182703

(51) Int. Cl.
*H01L 21/00* (2006.01)
*H01L 21/02* (2006.01)
(52) U.S. Cl. .................... 438/64; 257/441; 257/E21.56; 257/E27.135; 257/E31.117
(58) Field of Classification Search .................. 438/64, 438/457; 257/441, 444, 712, E21.56, E21.135, 257/E31.117
See application file for complete search history.

(56) References Cited

U.S. PATENT DOCUMENTS

| 2002/0027284 | A1  | 3/2002  | Ono |
| 2004/0012317 | A1* | 1/2004  | Obayashi et al. ............. 313/110 |
| 2005/0277268 | A1  | 12/2005 | Hoshika |
| 2006/0043544 | A1  | 3/2006  | Tsukamoto et al. |

(Continued)

FOREIGN PATENT DOCUMENTS

JP     2-225580     9/1990

(Continued)

OTHER PUBLICATIONS

International Search Report for International Application No. PCT/JP2008/000260 mailed May 27, 2008.

(Continued)

*Primary Examiner* — Walter L Lindsay, Jr.
(74) *Attorney, Agent, or Firm* — Smith, Gambrell & Russell, LLP

(57) ABSTRACT

A light receiving device 1 includes a support substrate 12 provided thereon with a photodetector 11 including a photodetecting portion 111 and a base substrate 112 on which the photodetecting portion 111 is placed; and a transparent substrate 13 disposed so as to oppose the face of the support substrate 12 on which the photodetector 11 is provided. Between the support substrate 12 and the transparent substrate 13, a frame portion 14 is provided so as to surround the photodetector 11. The frame portion 14 is a photo-curing adhesive, and directly adhered to the transparent substrate 13 and the support substrate 12. Such structure provides a light receiving device capable of exhibiting the desired performance, and a method of manufacturing such light receiving device can also be provided.

10 Claims, 4 Drawing Sheets

U.S. PATENT DOCUMENTS

2009/0053850 A1 2/2009 Nishida et al.

FOREIGN PATENT DOCUMENTS

| JP | 10-144898 | 5/1998 |
| JP | 2002-76313 | 3/2002 |
| JP | 2004-296453 | 10/2004 |
| JP | 2006-5025 | 1/2006 |
| JP | 2006-73546 | 3/2006 |
| JP | 2006-303482 | 11/2006 |

OTHER PUBLICATIONS

Korean Office Action issued on Apr. 20, 2011 for Korean Application No. 10-2010-7001432.

* cited by examiner (A)

(B)

(C)

LIGHT RECEIVING DEVICE AND METHOD OF MANUFACTURING LIGHT RECEIVING DEVICE

TECHNICAL FIELD

The present invention relates to a light receiving device and a method of manufacturing the light receiving device.

BACKGROUND ART

Light receiving devices so far developed include a solid state imaging device shown in FIG. 5. The solid state imaging device 100 includes a solid state imaging element 101 having a valid pixel domain 101A, and a light-transmissive cover 102 smaller in plan-view dimensions than the solid state imaging element 101.

In the solid state imaging device 100, though not shown, a bonding wire is connected to a portion of the solid state imaging element 101 projecting farther than the light-transmissive cover 102, for connection to a connection terminal provided on a support substrate, which is not shown either (Ref. patented document 1, for example).

[Patent document 1] Japanese Laid-open Patent Publication No. 2004-296453

DISCLOSURE OF THE INVENTION

Problem to be Solved by the Invention

In the solid state imaging device 100 according to the patented document 1, the solid state imaging element 101 and the light-transmissive cover 102 are bonded by an adhesive layer 103.

Such structure may allow the adhesive layer 103 to cover the valid pixel domain 101A on the solid state imaging element 101, which makes it difficult for the solid state imaging device 100 to fully perform as desired.

An object of the present invention is to provide a light receiving device that exhibits the desired performance, and a method of manufacturing such light receiving device.

Means for Solving the Problem

According to the present invention, there is provided a light receiving device comprising a support substrate provided thereon with a photodetector including a photodetecting portion and a base substrate on which the photodetecting portion is provided; a transparent substrate located so as to oppose a face of the support substrate on which the photodetector is provided; and a frame portion disposed between the support substrate and the transparent substrate so as to surround the photodetector; wherein the frame portion is an electron beam-curing adhesive and adhered to the transparent substrate and to the support substrate.

According to the present invention, the frame portion is provided between the transparent substrate and the support substrate, and adhered to these substrates. Accordingly, since the frame portion is not provided on the photodetector, the frame portion is kept from contacting the photodetecting portion of the photodetector. Such structure allows the light receiving device to fully exhibit the desired performance.

The electron beam referred to herein represents a concept encompassing radioactive rays having a wavelength of 150 nm to 700 nm, which include, for example, a near ultraviolet ray and an ultraviolet ray.

In the foregoing structure, the frame portion may be formed through selectively exposing an electron beam-curing adhesive film with the electron beam and removing an unirradiated portion, and it is preferable that halogen ion concentration of the adhesive film is equal to or lower than 500 ppm. In particular, it is preferable that the halogen ion concentration of the adhesive film is equal to or lower than 200 ppm.

The photodetector and the support substrate may be electrically connected through a wire, and the frame portion may be formed so as to surround an outer region of the wire. In this case, adjusting the halogen ion concentration of the adhesive film to 500 ppm or less enables preventing corrosion of the wire due to a compound originating from the halogen ion emerging from the frame portion.

The frame portion may be formed through selectively exposing with a light an adhesive film containing a UV-curing resin, which is an electron beam-curing resin, and removing an unexposed portion, and It is preferable that UV transmittance of the adhesive film is equal to or higher than 40% per 1 μm in thickness.

According to the present invention, the frame portion is provided between the transparent substrate and the support substrate having the photodetector placed thereon. Accordingly, the frame portion has to be higher (in other words, the adhesive film has to be thicker), compared with the conventional frame portion provided between the photodetector and the transparent substrate.

Adjusting the UV transmittance of the adhesive film to 40% or higher per 1 μm in thickness enables sufficiently photo-curing the adhesive film even in the case where the adhesive film is thick, to thereby form the frame portion.

It is preferable that the frame portion is formed through selectively exposing an electron beam-curing adhesive film with the electron beam, and removing an unexposed portion, and that the adhesive film is formed of a resin composition containing an electron beam-curing resin and a filler, and moisture permeability of the adhesive film is equal to or higher than 30 $[g/m^2 \cdot 24\ h]$ when measured according to JIS Z0208-B.

Forming the adhesive film from the resin composition containing the electron beam-curing resin and the filler and adjusting the moisture permeability to $30[g/m^2 \cdot 24\ h]$ or higher according to JIS Z0208-B enables securing ventilation between the space inside the frame portion formed of the adhesive film and the space outside thereof. Such structure allows preventing dew condensation on the transparent substrate and the support substrate.

Further, it is preferable that the filler includes a porous filler, and that the porous filler is zeolite.

Including the zeolite in the adhesive film enhances the moisture permeability of the frame portion, and thereby suppressing dew condensation in the inner space.

Further, it is preferable that the frame portion contains a curable resin that hardenable with either the electron beam or heat, and that the curable resin that hardenable with either the electron beam or heat contains a (meth)acrylic-modified phenol resin or a (meth)acrylic acid polymer containing a (meth)acryloyl group.

According to the present invention, there is also provided a method of manufacturing a light receiving device, comprising placing a photodetector including a photodetecting portion and a base substrate on which the photodetecting portion is provided, on a support substrate; adhering an adhesive film containing an electron beam-curing resin to a transparent substrate to be located so as to oppose the support substrate; selectively exposing the adhesive film with an electron beam and removing an unexposed portion, thereby leaving the adhesive film in a frame shape in a region surrounding a region on the transparent substrate that is to cover the photodetector when the transparent substrate is placed so as to oppose the support substrate; and disposing the support substrate and the transparent substrate so as to oppose each other and adhering the support substrate and the transparent substrate by the frame-shaped portion constituted of the adhesive film.

In this method, it is preferable that the adhesive film has a minimum melt viscosity equal to or higher than 1 Pa·s and equal to or lower than 30000 Pa·s, under a temperature range of 50° C. to 180° C. after the electron beam-curing with an integrated light quantity of 700 mJ/cm$^2$. In particular, it is preferable that the minimum melt viscosity is equal to or higher than 500 Pa·s. Likewise, it is preferable that the minimum melt viscosity is equal to or lower than 5000 Pa·s.

Generally, a multitude of interconnects is provided on the surface of the support substrate. Accordingly, adjusting the minimum melt viscosity of the adhesive film under the temperature range of 50° C. to 180° C. after the photo-curing to 30000 Pa·s or lower, or 5000 Pa·s or lower in particular, enables achieving high processability under a low temperature, which allows the adhesive film to fit with the support substrate at the low temperature, thus enhancing adhesion between the adhesive film and the support substrate.

Also, adjusting the minimum melt viscosity of the adhesive film under the temperature range of 50° C. to 180° C. after the photo-curing to 1 Pa·s or higher, or 500 Pa·s or higher in particular, enables inhibiting the adhesive film from excessively spreading.

Further, it is preferable that a wet spread factor of the adhesive film after the electron beam-curing with the integrated light quantity of 700 mJ/cm$^2$ is equal to or higher than 0.1%, and equal to or lower than 50%, and more preferably in a range of 5 to 30%. Adjusting the wet spread factor of the adhesive film after the electron beam-curing to 0.1% or higher allows the adhesive film to fit with the support substrate, thus enhancing adhesion between the adhesive film and the support substrate.

Still further, adjusting the wet spread factor of the adhesive film after the electron beam-curing to 50% or lower allows securing the necessary height of the frame portion constituted of the adhesive film.

It is also preferable that the process of leaving the adhesive film in a frame shape includes adjusting an electron beam curing reaction rate of the adhesive film to equal to or higher than 10%, and a thermosetting reaction rate to equal to or lower than 90%. More preferably, the electron beam curing reaction rate is to be equal to or higher than 70%, and the thermosetting reaction rate equal to or lower than 10%.

Adjusting the electron beam curing reaction rate of the adhesive film to 10% or higher in the process of leaving the adhesive film assures that the adhesive film is duly left in the frame-shaped pattern.

Also, adjusting the thermosetting reaction rate of the adhesive film to 90% or lower in the process of leaving the adhesive film enables achieving sufficient progress of the thermosetting reaction when adhering the support substrate and the transparent substrate, thereby assuring the adhesion between the support substrate and the transparent substrate by the adhesive film.

Advantage of the Invention

The present invention provides a highly reliable light receiving device, and a method of manufacturing such light receiving device.

BEST MODE FOR CARRYING OUT THE INVENTION

Hereunder, an embodiment of the present invention will be described based on the drawings.

Figure 1:
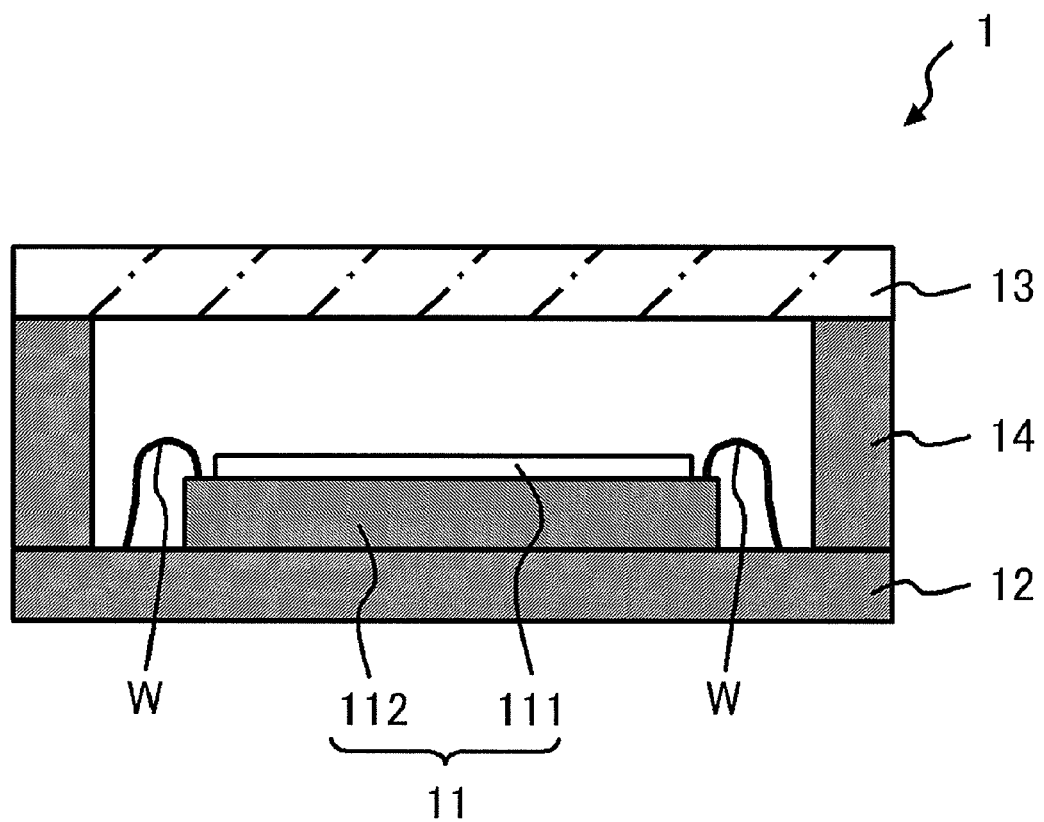
FIG. 1 is a cross-sectional view showing a light receiving device according to an embodiment of the present invention.

Referring to FIG. 1, description will be given on an outline of a light receiving device 1 according to this embodiment.

The light receiving device 1 according to this embodiment includes a support substrate 12 provided thereon with a photodetector 11 including a photodetecting portion 111 and a base substrate 112 on which the photodetecting portion 111 is provided, and a transparent substrate 13 located so as to oppose a face of the support substrate 12 on which the photodetector 11 is provided. Between the support substrate 12 and the transparent substrate 13, a frame portion 14 is provided so as to surround the photodetector 11. The frame portion 14 is constituted of an electron beam-curing adhesive, and directly adhered to the transparent substrate 13 and to the support substrate 12.

The structure of the light receiving device 1 will be described in further details as under.

The light receiving device 1 is to serve as a solid state imaging device.

The photodetector 11 includes the photodetecting portion 111 constituted of a microlens array, and the base substrate 112 with the photodetecting portion 111 placed thereon. On the lower face of the photodetecting portion 111, in other words on the base substrate 112 a photoelectric converter portion (not shown) is provided, and serves to convert a light received by the photodetecting portion 111 into an electrical signal.

The support substrate 12 is a substrate on the surface of which an interconnect formed. The support substrate 12 and the photodetector 11 are connected through a bonding wire W.

The transparent substrate 13 is a glass substrate disposed so as to oppose the support substrate 12.

The frame portion 14 is a photosensitive adhesive provided so as to surround the photodetector 11, and is adhered to the transparent substrate 13 and to the support substrate 12.

The position of the outer peripheral edge of the frame portion 14, that of the transparent substrate 13, and that of the support substrate 12 are generally flush with each other.

The frame portion 14 is obtained by forming an adhesive film 15 shown in FIG. 2(A) in a predetermined pattern, the details of which will be described later.

Here, it is preferable that an average coefficient of thermal expansion of the frame portion 14 under a temperature range of −40° C. to 50° C. is 150 ppm/° C. or lower, and in particular 85 ppm/° C. or lower. Adjusting the average coefficient of thermal expansion under the mentioned temperature to 150 ppm/° C. or lower, or 85 ppm/° C. or lower in particular, enables suppressing fluctuation in height of the frame portion 14 originating from heat under the environment of use.

In addition, the average coefficient of thermal expansion of the frame portion 14 can be measured as follows.

A cured resin film (adhesive film 15 to constitute the frame portion 14) is cut out in a size of 4 mm×20 mm, and displacement of the sample is measured while heating the sample at 5° C./minute from room temperature utilizing a thermal mechanical analyzer TMA (TMA/SS6000 manufactured by Seiko Instruments Inc.), and then the average coefficient of thermal expansion under the temperature range of −40° C. to 50° C. is calculated.

Now, it is preferable that the adhesive film 15 constituting the frame portion 14 is composed of a resin composition containing the electron beam-curing resin and a filler, and has a moisture permeability equal to or higher than 30 [g/m$^2$·24 h] when measured according to JIS Z0208-B.

It is preferable that the moisture permeability of the adhesive film 15 is 40 [g/m$^2$·24 h] or higher, and in particular 50 to 200[g/m$^2$·24 h]. The moisture permeability below the lower limit may lead to failure to effectively suppress dew condensation on the transparent substrate 13 and the like of the light receiving device 1. The moisture permeability exceeding the upper limit may lead to degradation in film formation performance of the adhesive film 15. The moisture permeability can be evaluated with the adhesive film 15 of 100 μm in thickness under the condition of 40° C./90%, according to a moisture pervious cup process (JIS Z0208-B).

The electron beam-curing resin can be exemplified by photo-curing resins, which include, for example, a UV-curing resin predominantly containing an acrylic compound, a UV-curing resin predominantly containing a urethane acrylate oligomer or polyester urethane acrylate oligomer, and a UV-curing resin predominantly containing at least one selected from the group of epoxy resins and vinylphenol resins and so forth.

In particular, it is preferable to employ the UV-curing resin predominantly containing an acrylic compound. The acrylic compound is quickly cured upon being exposed, and hence a relatively low exposure is sufficient for patterning the resin.

The acrylic compound can be exemplified by acrylic ester monomers or methacrylic ester monomers and so forth, which include bifunctional acrylates such as ethylene glycol diacrylate, ethylene glycol dimethacrylate, 1,6-hexanediol diacrylate, 1,6-hexanediol dimethacrylate, glycerin diacrylate, glycerin dimethacrylate, 1,10-decanediol diacrylates, and 1,10-decanediol dimethacrylate, multifunctional acrylates such as trimethylolpropane triacrylate, trimethylolpropane trimethacrylate, pentaerythritol triacrylate, pentaerythritol trimethacrylate, dipentaerythritol hexacrylate, and dipentaerythritol hexamethacrylate and so forth. Above all it is preferable to employ the acrylic ester, and in particular the acrylic ester or methacrylic alkylester having 1 to 15 carbon atoms in the ester moiety.

Although the content of the photo-curing resin (UV-curing resin) is not specifically limited, a preferable range is 5 to 60 wt % of the overall resin composition constituting the adhesive film 15, and in particular 8 to 30 wt %. The content below the lower limit may lead to failure to pattern the adhesive film 15 by UV exposure, and the content exceeding the upper limit may make the resin too soft and incur degradation in sheet characteristic before the UV exposure.

Also, it is preferable that the adhesive film 15 contains a photopolymerization starter.

This facilitates efficiently patterning the adhesive film 15 through photopolymerization.

Examples of the photopolymerization starter include benzophenone, acetophenone, benzoin, benzoin isobutylether, benzoin methyl benzoate, benzoin benzoic acid, benzoin methylether, benzyl finyl sulfide, benzyl, dibenzyl, diacetyl and so forth.

Although the content of the photopolymerization starter is not specifically limited, a preferable range is 0.5 to 5 wt % of the overall resin composition, and in particular 0.8 to 2.5 wt %. The content below the lower limit may lead to failure to effectively start the photopolymerization, and the content exceeding the upper limit may incur excessive reaction, which leads to degradation in preservability and resolution.

Further, it is preferable that the adhesive film 15 contains a thermosetting resin.

Examples of the thermosetting resin include novolac type phenol resins such as a phenol novolac resin, a cresol novolac resin, and a bisphenol A novolac resin, phenol resins such as a resole phenol resin, bisphenol type epoxy resins such as a bisphenol A epoxy resin and a bisphenol F epoxy resin, novolac type epoxy resins such as a novolac type epoxy resin and a cresol novolac epoxy resin, epoxy resins such as a biphenyl type epoxy resin, a stilbene type epoxy resin, a triphenyl methane type epoxy resin, alkyl-modified triphenyl methane type epoxy resin, a triazine nucleus-containing epoxy resin, and a dicyclopentadiene-modified phenol type epoxy resin, resins having a triazine ring such as a urea resin and a melamine resin, an unsaturated polyester resin, a bismaleimide resin, a polyurethane resin, a diallylphthalate resin, a silicone resin, a resin having a benzoxazine ring, a cyanate ester resin and so forth, which may be employed alone or in combination. Above all, the epoxy resin is particularly preferable. The epoxy resin further enhances heat-resistance and adhesion.

It is more preferable to employ an epoxy resin that is solid under room temperature (in particular, the bisphenol type epoxy resin) and another epoxy resin that is liquid under room temperature (in particular, a silicone-modified epoxy resin which is liquid under room temperature) in combination. Such arrangement enables obtaining the adhesive film 15 having heat resistance, as well as high flexibility and resolution.

Although the content of the thermosetting resin is not specifically limited, a preferable range is 10 to 40 wt % of the overall resin composition constituting the adhesive film 15, and in particular 15 to 35 wt %. The content below the lower limit may suppress the improvement in heat resistance, and the content exceeding the upper limit may suppress the improvement in toughness of the adhesive film 15.

Further, it is preferable that the adhesive film 15 contains a curable resin that hardenable with either light (electron beam) or heat. Employing such resin enables improving the mutual solubility of the electron beam-curing resin and the thermosetting resin, and thereby enhancing the strength of the adhesive film 15 after the curing (electron beam-curing and thermosetting).

Examples of the curable resin that hardenable with either light (electron beam) or heat include thermosetting resins having a photoreactive group such as an acryloyl group, a methacryloyl group, or a vinyl group, photo-curing resins having a thermoreactive group such as an epoxy group, a phenolic hydroxyl group, an alcohol hydroxyl group, a carboxyl group, an acid anhydride group, an amino group, or a cyanate group and so forth. More specifically, a (meth) acrylic-modified phenol resin, an acrylic copolymer resin having a carboxyl group and an acrylic group in a side chain, a (meth)acrylic acid polymer containing a (meth)acryloyl group and so forth can be cited. Above all, the (meth)acrylic-modified phenol resin is preferable. Employing such resin allows utilizing as the developing solution an alkaline aqueous solution, which imposes less impact to the environment, instead of an organic solvent, as well as maintaining heat-resisting capability.

In the case of the thermosetting resin having the photoreactive group, although the modification ratio (substitution ratio) of the photoreactive group is not specifically limited, a preferable range thereof is 20 to 80%, and in particular 30 to 70%, of the overall reactive groups of the curable resin that hardenable with either light or heat (total of the photoreactive group and the thermoreactive group). The modification amount within such range provides excellent resolution, in particular.

In the case of the photo-curing resin having the thermoreactive group, although the modification ratio (substitution ratio) of the thermoreactive group is not specifically limited, a preferable range thereof is 20 to 80%, and in particular 30 to 70%, of the overall reactive groups of the curable resin that hardenable with either light or heat (total of the photoreactive group and the thermoreactive group). The modification amount within such range provides excellent resolution, in particular.

Although the content of the curable resin that hardenable with either light (electron beam) or heat is not specifically limited, a preferable range thereof is 15 to 50%, and in particular 20 to 40%, of the overall resin composition constituting the adhesive film 15. The content below the lower limit may suppress the improvement in mutual solubility, and the content exceeding the upper limit may lead to degradation in developing performance and in resolution.

Preferably, the adhesive film 15 may contain a filler. The filler is an important component capable of controlling the moisture permeability of the adhesive film 15.

Examples of the filler include fibriform fillers such as an alumina fiber and a glass fiber, needle fillers such as potassium titanate, wollastonite, aluminum borate, needle magnesium hydroxide, and a whisker, plate fillers such as talc, mica, sericite, glass flake, flake graphite, and plate calcium carbonate, spherical (particulate) fillers such as calcium carbonate, silica, molten silica, sintered clay, and unsintered clay, porous fillers such as zeolite and silica gel and so forth. These fillers may be employed alone or in combination of two or more. Above all, the porous filler is preferable. Employing such filler enables increasing the moisture permeability of the adhesive film. Although the average particle diameter of the filler is not specifically limited, a preferable range thereof is 0.01 to 90 µm, and in particular 0.1 to 40 µm. The average particle diameter exceeding the upper limit may lead to degradation in appearance of the film and resolution, and the average particle diameter below the lower limit may result in defective adhesion in the heat-adhesion process.

The average particle diameter can be evaluated, for example, with a laser diffraction particle size distribution analyzer SALD-7000 (manufactured by Shimadzu Corporation).

Although the content of the filler is not specifically limited, a preferable range is 5 to 70 wt %, and in particular 20 to 50 wt %, of the overall resin composition constituting the adhesive film 15. The content exceeding the upper limit may result in defective adhesion in the heat-adhesion process, and the content below the lower limit may lead to degradation in moisture permeability, which may result in failure to suppress dew condensation on the transparent substrate 13 and other regions.

Regarding the filler, it is preferable to employ the porous filler. In the case of employing the porous filler as the filler, a preferable range of the average pore diameter of the porous filler is 0.1 to 5 nm, and in particular 0.3 to 1 nm. The average pore diameter exceeding the upper limit may cause a part of the resin components to intrude into the pore to thereby disturb the reaction, and the average pore diameter below the lower limit leads to degradation in water absorption, resulting in degraded moisture permeability of the adhesive film 15.

The porous filler can be specifically exemplified by a molecular sieve constituted of a crystalline zeolite. The crystalline zeolite is expressed as the following general formula:

$$M_{2/n}O.Al_2O_3.xSiO_2.yH_2O$$

M: metal cathion
n: atomic value

While applicable crystal types of the crystalline zeolite include 3A, 4A, 5A, and 13X, the types 3A and 4A are preferably employed, from the viewpoint of effective prevention of dew condensation.

Although the adsorption ability of the filler under room temperature [Q1] is not specifically limited, a preferable range is 7 [g/100 g of filler] or higher, and in particular 15 [g/100 g of filler] or higher. The adsorption ability under room temperature below the lower limit leads to insufficient water absorption performance of the filler, resulting in degraded moisture permeability of the adhesive film 15.

The adsorption ability under room temperature [Q1] can be obtained, for example, through measuring the filler completely dried by heating in an aluminum cup, and measuring the increase in weight after leaving the filler for 168 hours under an environment of 25° C./50%.

Also, though the adsorption ability of the filler at 60° C. [Q2] is not specifically limited, a preferable range is 3 [g/100 g of filler] or higher, and in particular 10 [g/100 g of filler] or higher. In the case where the adsorption ability is maintained at such level even at 60° C., dew condensation in the light receiving device 1 can be more effectively suppressed.

The adsorption ability at 60° C. [Q2] can be obtained, for example, through measuring the filler completely dried by heating in an aluminum cup, and measuring the increase in weight after leaving the filler for 168 hours under an environment of 60° C./90%.

Although the relationship between the adsorption ability of the filler under room temperature [Q1] and the adsorption ability at 60° C. [Q2] is not specifically limited, it is preferable that the following relationship is satisfied:

$$0.4 \times [Q1] < [Q2]$$

In the case where [Q1] and [Q2] satisfy such formula, condensation in the light receiving device 1 can be effectively suppressed, in particular.

A presumable reason is that, since the filler maintains the adsorption even under a high temperature, the film containing such filler can maintain the moisture permeability even under a relatively high temperature, which facilitates gaseous moisture to pass through the adhesive film 15, and therefore the moisture in the light receiving device 1 can instantaneously escape when the high temperature falls to the room temperature, and thus such dew condensation phenomenon is suppressed.

The resin composition constituting the adhesive film 15 may also contain such additives as a plastic resin, a leveling agent, an antifoaming agent, and a coupling agent within the scope of the present invention, in addition to the foregoing curable resin and the filler.

Further, it is preferable that halogen ion concentration of the adhesive film 15, that is halogen ion concentration of the frame portion 14, is in a range of 500 ppm or lower and 0 ppm or higher. In particular, it is preferable that the halogen ion concentration of the adhesive film 15 is 200 ppm or lower.

More preferably, the halogen ion concentration of the adhesive film 15 may be 100 ppm or lower.

To reduce the content of halogen ion impurities in the frame portion 14 to 500 ppm or lower, for example a thermoplastic resin having a low content of chloride ion (such as an epoxy resin) may be employed as the material for the adhesive film 15, or the mixing ratio of such a resin containing the halogen ion may be reduced.

Here, the halogen ion concentration of the adhesive film 15 can be measured as follows.

The adhesive film 15 is freeze-ground into fine powder of 250 μm or less in particle diameter.

Then 4 g of the specimen powder is precisely measured in an extraction container made of Teflon (registered trademark), and 40.0 ml of ultrapure water is added.

The specimen is then put in an oven to perform heat-press extraction at 125° C. for 20 hours.

After cooling the specimen to room temperature, the specimen is filtered to thereby obtain test solution.

Then the test solution and standard solution are introduced into an ion chromatography, to thereby obtain the halogen ion concentration by a calibration curve method.

Further, it is preferable that minimum melt viscosity of the adhesive film 15 under a temperature range of 50° C. to 180° C. after the electron beam-curing (photo-curing) is equal to or higher than 1 Pa·s and equal to or lower than 30000 Pa·s.

In particular, it is preferable that the minimum melt viscosity is equal to or higher than 500 Pa·s, and more preferably equal to or higher than 900 Pa·s. Meanwhile, it is preferable that the minimum melt viscosity is equal to or lower than 5000 Pa·s, and more preferably equal to or lower than 2500 Pa·s.

The minimum melt viscosity of the adhesive film 15 after the photo-curing can be measured as follows.

The adhesive film 15 is exposed with an electron beam (light) such that the integrated light quantity becomes 700 mJ/cm², to thereby cure the film.

Then the minimum melt viscosity under the temperature range of 50° C. to 180° C. is measured while increasing the temperature at the rate of 10° C./minute from the room temperature. For example a rheometer, a viscoelasticity measuring instrument, may be employed to measure the minimum melt viscosity by shearing the photo-cured adhesive film 15 at the frequency of 1 Hz, under the temperature increase of 10° C./minute.

Further, it is preferable that a wet spread factor of the adhesive film 15 after the electron beam-curing (photo-curing) is equal to or higher than 0.1% and equal to or lower than 50%. It is more preferable that the wet spread factor is equal to or higher than 5% and equal to or lower than 30%.

The wet spread factor of the adhesive film 15 after the electron beam-curing can be measured as follows.

The adhesive film 15 is laminated over a silicon wafer at 60° C. Then the film is exposed with the integrated light quantity of 700 mJ/cm², and 3% aqueous solution of tetramethyl ammonium hydroxide (TMAH) of 25° C. is utilized to develop the film under 0.3 MPa for 90 seconds, to thereby form a circular pattern of 1600 μm in diameter. The diameter of the circular pattern is then measured.

Further, the adhesive film 15 patterned in the circular shape on the wafer is heat-press bonded onto a glass at 120° C., 4.9 MPa, for 5 seconds. Thereafter, the diameter of the circular pattern of the adhesive film 15 thus heat-press bonded is measured.

Wet spread factor (%)=(diameter after press bonding−diameter before press bonding)×100/diameter before press bonding Further, it is preferable that thermosetting shrinkage rate of the adhesive film 15 after curing at 150° C./1 hour is equal to or less than 10%. In particular, it is preferable that the shrinkage is equal to or less than 5%.

The thermosetting shrinkage rate can be measured as follows.

The adhesive film 15 is laminated over a silicon wafer at 60° C. Then the film is exposed with the integrated light quantity of 700 mJ/cm², and 3% aqueous solution of tetramethyl ammonium hydroxide (TMAH) of 25° C. is utilized to develop the film under 0.3 MPa for 90 seconds, to thereby form a linear resin pattern of 200 μm in line width. A surface texture measuring instrument (Surfcom 1400D manufactured by Tokyo Seimitsu Co., Ltd.) is then utilized to measure the height (thickness) of the linear resin pattern. The pattern is further cured at 150° C./1 hour, after which the height (thickness) of the linear resin pattern is measured.

Thermosetting shrinkage rate (%)=[(pattern height before heating)−(pattern height after heating)]×100/(pattern height before heating)

Still further, it is preferable that the adhesive film 15 retains, after the photo-curing, such adhesion capability that keeps the film from peeling off from the transparent substrate in a dicing process.

Still further, it is preferable that the adhesive film 15 contains a UV-curing resin, and that thicknesswise UV transmittance of the adhesive film 15 is equal to or higher than 40% per 1 μm in thickness. In particular, it is preferable that the UV transmittance is equal to or higher than 45%.

On the other hand, it is preferable that the thicknesswise UV transmittance of the adhesive film 15 is equal to or lower than 70% per 1 μm in thickness.

The UV transmittance of the adhesive film 15 can be measured as follows.

The adhesive film 15 is prepared in a thickness of 3.5 μm and exposed with a light of 365 nm, and then the UV transmittance is measured with a UV-visible spectrophotometer (UV-160A manufactured by Shimadzu Corporation). Based on the measured value the UV transmittance per unit thickness (1 μm) is calculated according to the Lambert-Beer law (formula given below).

$$\text{Log}_{10}(I/I_0) = \epsilon c l$$

Figure 2:
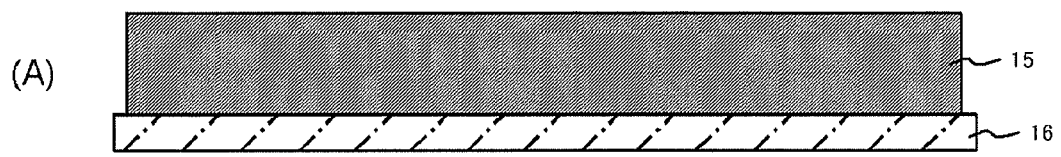
FIG. 2 are frame format views showing a manufacturing process of the light receiving device.
Figure 2:
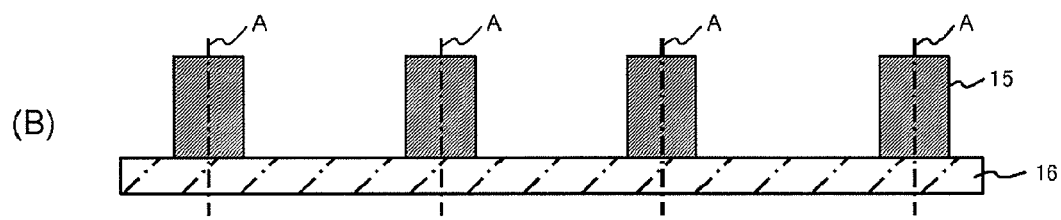
Figure 2:
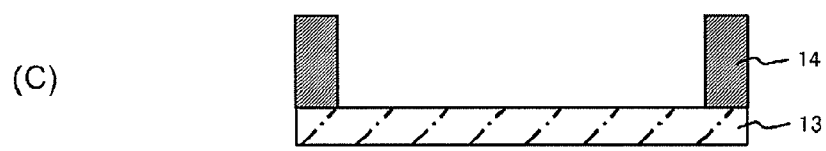

I: intensity of transmitted light, $I_0$: intensity of incident light, c: concentration, $\epsilon$: optical path length, l: absorption coefficient Next referring now to FIGS. 1 and 2, a method of manufacturing the light receiving device 1 will be described.

The photodetector 11 is placed on the support substrate 12. The photodetector 11 and the support substrate 12 are then connected through the bonding wire W.

Then as shown in FIG. 2(A), a large plate of glass substrate (light-transmissive plate) 16, in which a plurality of transparent substrates 13 is unified, is prepared.

And to the surface of the glass substrate 16, the adhesive film 15 is adhered.

Figure 3:
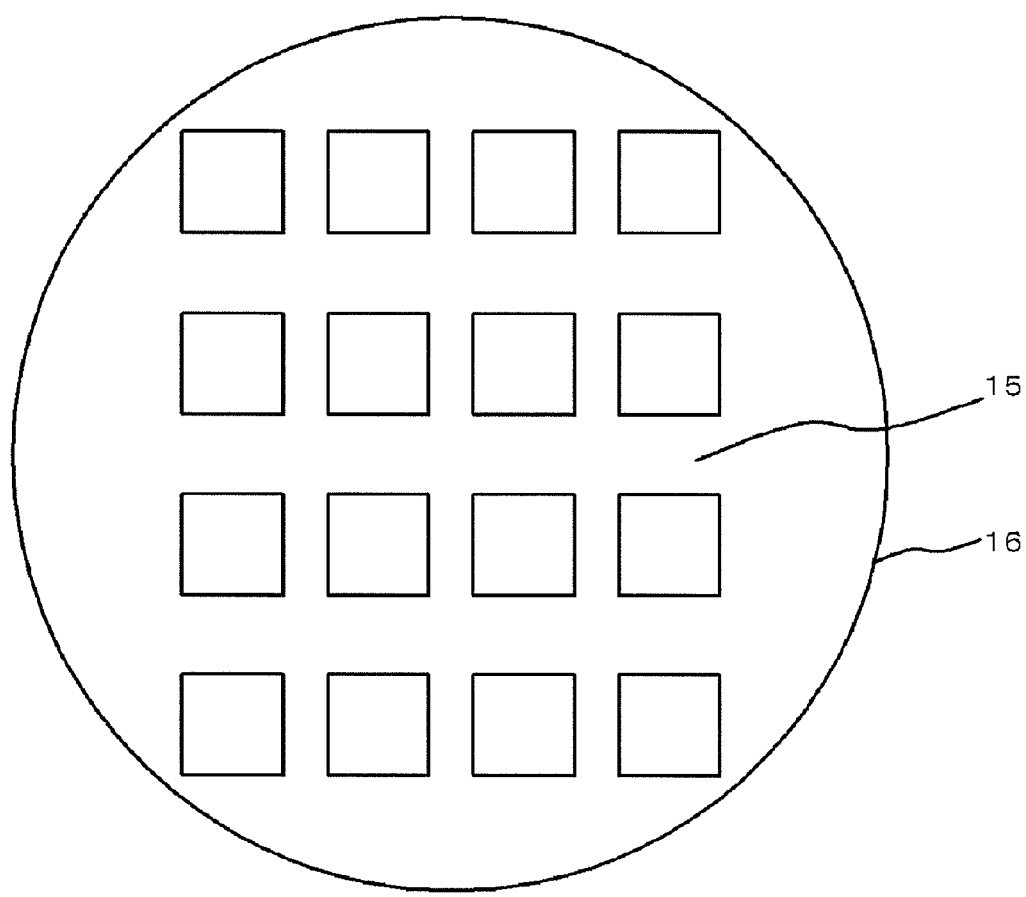
FIG. 3 is a plan view showing an adhesive film selectively left on a transparent substrate.

Then as shown in FIG. 2(B), the adhesive film 15 is left in a frame shape in a region surrounding a region on the glass substrate 16 intended to cover the photodetector 11. To be more detailed, a photomask is employed to selectively expose the adhesive film 15 with a light. Thus the exposed portion of the adhesive film 15 is photo-cured. Then the adhesive film 15 thus exposed is developed by a developing solution (for example, an alkali aqueous solution or an organic solvent). The unexposed portion is dissolved in the developing solution thus to be removed, and the exposed is undissolved in the developing solution thus to be left. More specifically, the adhesive film 15 is left in a grid pattern as shown in the plan view of FIG. 3.

In this process of leaving the adhesive film 15 in the frame shape, it is preferable that the electron beam curing reaction rate (photo-curing reaction rate) of the adhesive film 15 is set to be 10% or higher, and the thermosetting reaction rate to be 90% or lower. More preferably, the electron beam curing reaction rate is 70% or higher, and the thermosetting reaction rate is 10% or lower. Here, the thermosetting reaction rate may be 0%.

The electron beam curing reaction rate of the adhesive film 15 can be obtained utilizing a photo-DSC (DSC6200 and UV exposure unit UV-1, both manufactured by Seiko Instrument Inc.). An unexposed adhesive film (adhesive film A) and an adhesive film (adhesive film B) exposed in advance to a light of a quantity required for pattern exposure (700 mJ/cm$^2$) are prepared, and both are subjected to photo-DSC measurement (illuminance 50 mW/cm$^2$, for 3 minutes). Based on the calorific value of the respective adhesive films, the electron beam curing reaction rate is calculated according to the following formula.

Electron beam curing reaction rate (%)=[(calorific value of film $A$)−(calorific value of film $B$)]×100/(calorific value of film $A$)

Also, the thermosetting reaction rate of the adhesive film 15 can be obtained utilizing a FT-IR (Paragon 1000, manufactured by PerkinElmer Co., Ltd.).

The unexposed adhesive film A and the adhesive film B exposed in advance to a light of a quantity required for pattern exposure (700 mJ/cm$^2$) are prepared, and both are subjected to FT-IR spectrometry (number of times: 16 times). Then based on aromatic ring-derived peak intensity (vicinity of 1512 cm$^{-1}$) of the IR spectrum thus obtained and the thermosetting functional group-derived peak intensity (for example, epoxy group-derived peak intensity (vicinity of 915 cm$^{-1}$)), the thermosetting reaction curing rate is calculated according to the following formula.

thermosetting reaction curing rate (%)={[(thermosetting functional group-derived peak intensity of film $A$)/(aromatic ring peak intensity of film $A$)]−[(thermosetting functional group-derived peak intensity of film $B$)/(aromatic ring peak intensity of film $B$)]}×100/[(thermosetting functional group-derived peak intensity of film $A$)/(aromatic ring peak intensity of film $A$)]

In the case, for example, where the adhesive film 15 contains a bismaleimide resin, the peak of the maleimide group may be adopted as the thermosetting functional group-derived peak. Likewise, in the case where the adhesive film 15 contains a cyanate ester resin, the peak of the cyanate ester group may be adopted.

The glass substrate 16 is then diced into each region intended to cover the photodetector 11. In the process of dicing the glass substrate 16, the adhesive film 15 remaining in the frame shape is also diced. Dash-dot lines of FIG. 2(B) indicate the dicing line. Through such process, the transparent substrate 13 and the frame portion 14 located on the transparent substrate 13 can be obtained, as shown in FIG. 2(C).

Then the transparent substrate 13 with the frame portion 14 provided thereon and the support substrate 12 are disposed so as to oppose each other, and the transparent substrate 13 and the support substrate 12 are bonded by means of the frame portion 14. To be more detailed, the transparent substrate 13 and the support substrate 12 are pressed or heat-pressed with the frame portion 14 held therebetween.

Here, although the adhesive film 15 is diced before the support substrate 12 and the transparent substrate 13 are bonded in this embodiment, instead for example the support substrate 12 may first be adhered to the glass substrate 16, after which the adhesive film 15 and the glass substrate 16 may be diced.

Next the advantages of this embodiment will now be described hereunder.

In this embodiment, the frame portion 14 is provided between the transparent substrate 13 and the support substrate 12, and is directly adhered to these substrates 12, 13. Since the frame portion 14 is not located on the photodetector 11, the frame portion 14 is kept from contacting the photodetecting portion 111 of the photodetector 11. Accordingly, the light receiving device 1 can fully exhibit the desired performance.

Further in this embodiment, since the frame portion 14 is provided between the support substrate 12 and the transparent substrate 13, the frame is formed so as to be higher compared with the case where the frame is provided between the photodetector 11 and the transparent substrate 13. Adjusting the UV transmittance of the adhesive film 15 per 1 μm to 40% or higher assures that the adhesive film 15 is sufficiently photo-cured even when the adhesive film 15 is thick.

Also, in this embodiment the photodetector 11 and the support substrate 12 are connected through the wire W, and the outer region of the wire W is surrounded by the frame.

Since the halogen ion concentration of the adhesive film 15 constituting the frame portion 14 is set to be 500 ppm or lower, the wire can be prevented from being corroded by halogen gas emerging from the frame portion 14.

Also, mixing the zeolite in the frame portion 14 enables improving the moisture permeability of the frame portion 14.

Such arrangement allows suppressing dew condensation in the space enclosed by the frame portion 14, the transparent substrate 13, and the support substrate 12.

Further, the support substrate 12 is provided with a multitude of interconnects formed thereon. Accordingly, adjusting the minimum melt viscosity of the adhesive film 15 under the temperature range of 50° C. to 180° C. after the photo-curing to 30000 Pa·s or lower allows the adhesive film 15 to fit with the surface profile of the support substrate 12, thus enhancing adhesion between the adhesive film 15 and the support substrate 12.

On the other hand, adjusting the minimum melt viscosity of the adhesive film 15 under the temperature range of 50° C. to 180° C. after the photo-curing to 1 Pa·s or higher, or 500 Pa·s or higher in particular, enables inhibiting the adhesive film 15 from excessively spreading.

Further, adjusting the wet spread factor of the adhesive film 15 after the electron beam-curing to 0.1% or higher allows the adhesive film 15 to fit with the support substrate 12, thus enhancing adhesion between the adhesive film 15 and the support substrate 12.

Still further, adjusting the electron beam curing reaction rate of the adhesive film 15 to 10% or higher in the process of leaving the adhesive film 15 assures that the adhesive film 15 is duly formed in the frame-shaped pattern.

Also, adjusting the thermosetting reaction rate of the adhesive film to 90% or lower in the process of leaving the adhesive film 15 enables achieving sufficient progress of the thermosetting reaction when adhering the support substrate 12 and the transparent substrate 13, thereby assuring the adhesion between the support substrate 12 and the transparent substrate 13 by means of the adhesive film.

Still further, setting the thermosetting shrinkage rate of the adhesive film through curing at 150° C./1 hour to be 10% or lower enables reducing fluctuation in height of the frame portion 14 constituted of the adhesive film 15.

It is to be noted that the present invention is not limited to the foregoing embodiment, and that modifications and improvements to such extent that allows achieving the object of the present invention will be included in the present invention.

To cite a few examples, although the embodiment specifies that the preferable moisture permeability of the adhesive film 15 measured according to JIS Z0208-B is 30 [g/m$^2$·24 h] or higher, the present invention is not limited to such setting. For example, the adhesive film may be formed so as to have low moisture permeability to thereby keep moisture from being transmitted through the frame. Such arrangement enables initially preventing the intrusion of moisture into inside the frame.

Figure 4:
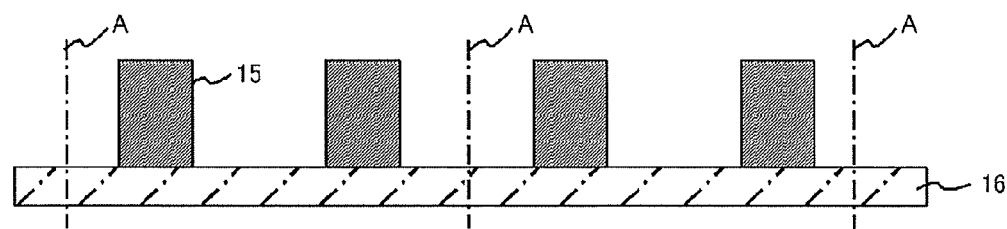
FIG. 4 is a frame format view showing a variation of the present invention.
Figure 5:
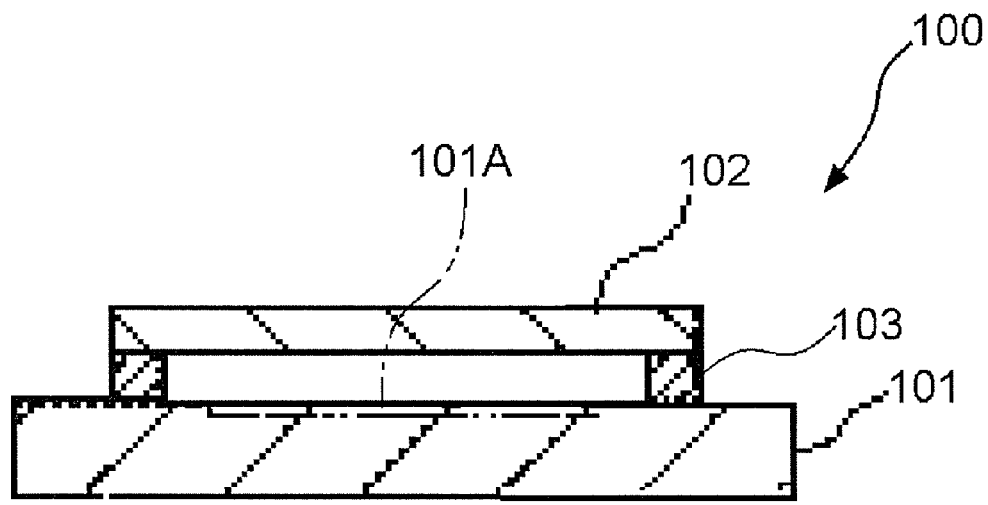
FIG. 5 is a frame format view showing a conventional solid state imaging device.

Also, although the adhesive film 15 is diced at a time when the glass substrate 16 is diced in the embodiment, instead the adhesive film 15 may be kept from being diced, for example as shown in FIG. 4 (line A in FIG. 4 indicates the dicing line). In this case, the adhesive film 15 may be exposed with a light so as to leave the adhesive film 15 in a plurality of frame-shaped portions.

WORKING EXAMPLES

Hereunder, working examples of the present invention will be described.

Working Example 1

1) Synthesizing a Curable Resin that Hardenable with Either Light or Heat (Acrylic-Modified Phenol Resin)

600 g (OH approximately 4 equivalent) of MEK solution of phenol novolac (Phenolite TD-2090-60M manufactured by DIC Corporation) containing 70% of nonvolatile matter was put in a 2-liter flask, and 1 g of tributylamine and 0.2 g of hydroquinone were added, and then the solution was heated to 110° C. 284 g of glycidyl methacrylate (2 mol) was dripped in 30 minutes into the solution, after which stirring reaction was performed at 110° C. for 5 hours, to thereby obtain phenol novolac containing methacryloyl group and 80% of nonvolatile matter (methacryloyl group modification ratio 50%).

2) Preparation of Resin Varnish 6.1 wt % of acrylic resin compound (2,2-bis{4-(acryloxy-diethoxy)phenyl}propane, NK Ester A-BPE-4 manufactured by Shin-Nakamura Chemical Co., Ltd.), liquid under room temperature, to serve as the photo-curing resin; 12.1 wt % of epoxy resin (Epiclon N-770 manufactured by DIC Corporation) to serve as the thermosetting resin; 6.4 wt % of silicone epoxy resin (BY16-115 manufactured by Dow Corning Toray Co., Ltd.); 27.0 wt % of the (meth)acrylic-modified phenol resin synthesized as above, to serve as the curable resin that hardenable with either light or heat; 1.9 wt % of photopolymerization starter (IRGACURE 651 manufactured by Ciba Specialty Chemicals Corporation); 31.8 wt % of porous filler (molecular sieve 3A manufactured by Union Showa K. K.) to serve as the filler; and 14.7 wt % of methylethyl ketone to serve as solvent were scale-weighed, and a disperser was employed to stir the solution at 5000 rpm for one hour, to thereby prepare the resin varnish.

3) Making Up an Adhesive Film

The foregoing resin varnish was applied to a base material polyester film (T100G, 25 μm in thickness, manufactured by Mitsubishi Plastics, Inc.) with a comma coater, and dried at 80° C. for 10 minutes, to thereby obtain an adhesive film of 50 μm in thickness.

Working Example 2

The same process was performed as the working example 1, except that the following resin was employed as the curable resin that hardenable with either light or heat.

An acrylic copolymer resin having a carboxyl group and an acrylic group in the side chain (Cyclomer P, ACA 20M manufactured by Daicel Cytec Co., Ltd.) was employed as the curable resin that hardenable with either light or heat.

Working Example 3

The same process was performed as the working example 1, except that the mixture of the resin varnish was arranged as follows.

7.8 wt % of acrylic resin monomer (2,2-bis{4-(acryloxy-diethoxy)phenyl}propane, NK Ester A-BPE-4 manufactured by Shin-Nakamura Chemical Co., Ltd.), liquid under room temperature, to serve as the photo-curing resin; 12.9 wt % of bis-A novolac epoxy resin (Epiclon N-770 manufactured by DIC Corporation) to serve as the thermosetting resin; 3.5 wt % of silicone epoxy resin (BY16-115 manufactured by Dow Corning Toray Co., Ltd.); 26.2 wt % of the (meth) acrylic-modified phenol novolac resin synthesized according to the working example 1; 0.9 wt % of photopolymerization starter (IRGACURE 651 manufactured by Ciba Specialty Chemicals Corporation); 23.4 wt % of silica filler (SE2050 Admatechs Co., Ltd.) to serve as the inorganic filler; and 25.3 wt % of methylethyl ketone to serve as the solvent.

The adhesive films obtained according to the respective working examples were subjected to evaluation in terms of moisture permeability rate, halogen ion concentration, minimum melt viscosity under the temperature range of 50° C. to 180° C. after photo-curing, wet spread factor after photo-curing, and UV transmittance.

Here, the evaluation of those aspects was performed according to the description in the embodiment.

The wavelength of the light for photo-curing the adhesive film was set at 365 nm. Further, as the exposure unit, model HMW-201GX manufactured by Ork Manufacturing Co., Ltd. was employed. The integrated light quantity was set to be 700 mJ/cm$^2$.

Meanwhile the moisture permeability rate was measured as follows.

The adhesive films were stuck to each other with a laminator set at 60° C. to thereby make up a film of 100 μm in thickness, and after exposure with an exposure unit with the light amount of 750 mJ/cm$^2$ (wavelength 365 nm) the film was subjected to thermosetting at 120° C. for one hour, and at 180° C. for another hour. The cured film thus obtained was evaluated according to the moisture pervious cup process (JIS Z0208-B) under the environment of 40° C./90%, to thereby obtain the moisture permeability rate.

TABLE 1

|  | Working Example 1 | Working Example 2 | Working Example 3 |
| --- | --- | --- | --- |
| Halogen ion concentration (ppm) | 98.1 | 13.8 | 4.8 |
| Moisture Permeability Rate 40° C./90% [g/m²24 h] | 81.4 | 79.8 | 20.1 |
| Minimum Melt Viscosity (Pa·s) | 2074 | 883 | 1810 |
| Wet Spread Factor (%) | 18.1 | 10.2 | 14.1 |
| UV Transmittance (%) | 50 | 59 | 65 |

Then a light receiving device was made up according to the process described in the embodiment, utilizing the adhesive film from the respective working examples.

Here, the exposure was performed with a light of 365 nm in wavelength and light amount of 750 mJ/cm², and the development was performed in 3% tetraammonium hydroxide (TMAH), under a spray pressure of 0.1 MPa for 90 seconds. Also, the adhesive film was patterned in a grid pattern, in which the adhesive film was given a width of 100 μm and formed so as to surround the region to cover each photodetector in a frame shape.

In the process of leaving the adhesive film in the frame shape, the photo-curing reaction rate and the thermosetting reaction rate of the adhesive film was set as follows. The measurement method of the photo-curing reaction rate and the thermosetting reaction rate of the adhesive film is as described in the embodiment. Here, the epoxy group-derived peak intensity was adopted as the thermosetting functional group-derived peak intensity.

TABLE 2

|  | Working Example 1 | Working Example 2 | Working Example 3 |
| --- | --- | --- | --- |
| Photo-curing reaction rate (%) | 90 | 84 | 95 |
| Thermosetting reaction rate (%) | 0 | 7 | 0 |

Also, the transparent substrate and the support substrate were bonded to each other by heat-pressing (temperature 110° C., duration 10 seconds, pressure 1 MPa). Thereafter, the substrates were cured at 120° C. for one hour, and then at 180° C. for two hours.

It has been confirmed that the light receiving device thus obtained bears desired characteristics, and shows no failure in operation.

Further, the coefficient of thermal expansion of the frame of the light receiving device has proved to be as shown below, through measurement thereof according to the method described in the embodiment, which confirms that fluctuation in height of the frame due to heat imposed under the environment of use can be suppressed.

TABLE 3

|  | Working Example 1 | Working Example 2 | Working Example 3 |
| --- | --- | --- | --- |
| Coefficient of thermal expansion (ppm) | 65 | 78 | 61 |

The invention claimed is:

1. A light receiving device, comprising:
   a photodetector including a photodetecting portion and a base substrate on which said photodetecting portion is provided;
   a support substrate on which said photodetector is formed;
   a transparent substrate located so as to oppose a face of said support substrate on which said photodetector is provided; and
   a frame portion disposed between said support substrate and said transparent substrate so as to surround said photodetector, wherein
   said frame portion is formed by selectively exposing an electron beam-curing adhesive film with said electron beam and removing an unexposed portion;
   a halogen ion concentration of said adhesive film is equal to or lower than 500 ppm; and
   UV transmittance of said adhesive film is equal to or higher than 40% per 1 μm in thickness.

2. The light receiving device according to claim 1,
   wherein said adhesive film is formed of a resin composition containing an electron beam-curing resin and a filler, and moisture permeability rate of said adhesive film is equal to or higher than 30[g/m²·24 h] when measured according to JIS Z0208-B.

3. The light receiving device according to claim 2,
   wherein said filler includes a porous filler; and
   said porous filler is zeolite.

4. The light receiving device according to claim 1,
   wherein said frame portion contains a curable resin hardenable by both said electron beam and heat.

5. The light receiving device according to claim 4,
   wherein said curable resin hardenable by both said electron beam or heat contains a (meth)acrylic-modified phenol resin or a (meth)acrylic acid polymer containing a (meth)acryloyl group.

6. A method of manufacturing a light receiving device, comprising:
   placing a photodetector including a photodetecting portion and a base substrate on which said photodetecting portion is provided, on a support substrate;
   adhering an adhesive film containing an electron beam-curing resin over a transparent substrate to be located so as to oppose said support substrate;
   selectively exposing said adhesive film with an electron beam and removing an unexposed portion, thereby leaving said adhesive film in a frame shape in a region surrounding a region on said transparent substrate that is to cover said photodetector when said transparent substrate is placed so as to oppose said support substrate; and
   disposing said support substrate and said transparent substrate so as to oppose each other and adhering said support substrate and said transparent substrate by said frame-shaped portion constituted of said adhesive film.

7. The method of manufacturing a light receiving device according to claim 6,
   wherein minimum melt viscosity of said adhesive film is equal to or higher than 1 Pa·s and equal to or lower than 30000 Pa·s under a temperature range of 50° C. to 180° C., after said electron beam-curing with an integrated light quantity of 700 mJ/cm².

8. The method of manufacturing a light receiving device according to claim 6,
wherein a wet spread factor of said adhesive film after said electron beam-curing with said integrated light quantity of 700 mJ/cm$^2$ is equal to or higher than 0.1%, and equal to or lower than 50%.

9. The method of manufacturing a light receiving device according to claim 6,
wherein said adhesive film contains a thermosetting resin; and
said leaving said adhesive film in a frame shape includes adjusting an electron beam curing reaction rate of said adhesive film to equal to or higher than 10%, and a thermosetting reaction rate to equal to or lower than 90%.

10. The light receiving device according to claim 1,
wherein said photodetector and said support substrate are connected through a wire.

* * * * *